(12) United States Patent
Betz et al.

(10) Patent No.: US 12,414,246 B2
(45) Date of Patent: Sep. 9, 2025

(54) FILTERING APPARATUSES AND SYSTEMS FOR ELECTRONIC ENCLOSURES

(71) Applicant: Nokia Solutions and Networks Oy, Espoo (FI)

(72) Inventors: Todd Betz, Dallas, TX (US); Anthony Salter, Dallas, TX (US); Diego Antonio Magallanes, Zapopan (MX)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 18/778,673

(22) Filed: Jul. 19, 2024

(65) Prior Publication Data

US 2025/0048568 A1 Feb. 6, 2025

(30) Foreign Application Priority Data

Aug. 3, 2023 (FI) .................................. 20235864

(51) Int. Cl.
*H05K 5/02* (2006.01)
(52) U.S. Cl.
CPC .................. *H05K 5/0214* (2022.08)
(58) Field of Classification Search
CPC ...................................... H05K 5/021
USPC ...................................... 220/367.1
See application file for complete search history.

(56) References Cited

U.S. PATENT DOCUMENTS

| | | | | |
|---|---|---|---|---|
| 5,586,436 A | * | 12/1996 | Sakaguchi | B60T 11/26 220/367.1 |
| 11,560,962 B2 | | 1/2023 | Nakayama et al. | |
| 2006/0096985 A1 | * | 5/2006 | Stolzman | B65D 51/1644 220/259.2 |
| 2011/0084076 A1 | * | 4/2011 | Whelan | B60K 15/0406 220/367.1 |
| 2012/0168453 A1 | | 7/2012 | Chiu | |

(Continued)

FOREIGN PATENT DOCUMENTS

| | | |
|---|---|---|
| CN | 108397585 A | 8/2018 |
| DE | 102021122477 A1 | 3/2023 |

(Continued)

OTHER PUBLICATIONS

Office action received for corresponding Finnish Patent Application No. 20235864, dated Dec. 22, 2023, 7 pages.

(Continued)

*Primary Examiner* — Orlando E Aviles
*Assistant Examiner* — Niki M Eloshway
(74) *Attorney, Agent, or Firm* — Nokia Technologies Oy

(57) ABSTRACT

An apparatus for attaching to an electronic unit includes a base and a cover. The base includes a bottom wall defining an opening, a first sidewall extending from a perimeter of the bottom wall, a support wall, and a second sidewall. The first sidewall and the second sidewall extend from respective ends of the support wall such that a groove is defined between the first sidewall, the support wall, and the second sidewall. The cover is configured to be coupled to the base and includes a top wall including a first side and a second side, a third sidewall extending from a perimeter of the second side of the top wall, and at least one spacer extending from the second side of the top wall and configured to define a cavity between the base and the cover.

16 Claims, 10 Drawing Sheets

(56) References Cited

U.S. PATENT DOCUMENTS

| | | | |
|---|---|---|---|
| 2016/0146094 A1* | 5/2016 | Cha | F01P 11/0247 |
| | | | 220/203.24 |
| 2019/0119457 A1* | 4/2019 | Sasscer | F16J 13/02 |
| 2021/0010655 A1 | 1/2021 | Kim | |
| 2021/0077936 A1 | 3/2021 | Song et al. | |
| 2021/0320375 A1 | 10/2021 | Zbiral et al. | |
| 2023/0038635 A1* | 2/2023 | Aldana | B65D 45/18 |

FOREIGN PATENT DOCUMENTS

| | | | |
|---|---|---|---|
| EP | 0157285 A2 * | 10/1985 | |
| WO | 2005/100832 A1 | 10/2005 | |
| WO | WO-2023167451 A1 * | 9/2023 | |

OTHER PUBLICATIONS

Office action received for corresponding Finnish Patent Application No. 20235864, dated Apr. 19, 2024, 7 pages.

Extended European Search Report received for corresponding European Patent Application No. 24187928.7, dated Dec. 16, 2024, 6 pages.

* cited by examiner

FILTERING APPARATUSES AND SYSTEMS FOR ELECTRONIC ENCLOSURES

RELATED APPLICATION

This application claims benefit of priority from Finnish Patent App. No. 20235864, filed Aug. 3, 2023, the disclosure of which is hereby incorporated in its entirety by reference herein.

TECHNICAL FIELD

One or more example embodiments relate to filtering apparatuses and systems for electronic enclosures.

BACKGROUND

Enclosures for electrical units include openings or vents that allow air to enter and exit the enclosure. Such openings or vents may become blocked, such as by liquid and/or dust, preventing air flow and creating pressure within the enclosure, which may cause the electronic unit to malfunction.

SUMMARY

At least one example embodiment relates to an apparatus for attaching to an electronic unit. The apparatus includes a base and a cover. The base includes a bottom wall defining an opening, a first sidewall extending from a perimeter of the bottom wall, a support wall, and a second sidewall. The first sidewall and the second sidewall extend from respective ends of the support wall such that a groove is defined between the first sidewall, the support wall, and the second sidewall. The cover is configured to be coupled to the base and includes a top wall including a first side and a second side, a third sidewall extending from a perimeter of the second side of the top wall, and at least one spacer extending from the second side of the top wall and configured to define a cavity between the base and the cover.

In at least one example embodiment, the at least one spacer includes a protrusion extending from a center of the second side of the top wall and a plurality of ribs extending from the second side of the top wall between the protrusion and the third sidewall. The plurality of ribs are configured to contact at least a top surface of the support wall of the base.

In at least one example embodiment, an interior surface of the third sidewall of the cover, the second side of the top wall of the cover, an exterior surface of the second sidewall, and a top surface of the support wall define a first fluid pathway. An interior surface of the third sidewall of the cover, the second side of the top wall of the cover, an exterior surface of the second sidewall, a top surface of the support wall, and an interior surface of the first sidewall define a second fluid pathway.

In at least one example embodiment, the first fluid pathway is a liquid pathway configured to direct liquid away from the electronic unit and the second fluid pathway is an air pathway in fluid communication with the electronic unit.

In at least one example embodiment, the apparatus includes an air vent within the opening of the bottom wall.

In at least one example embodiment, the air vent is configured to prevent passage of liquid and solid particles into the electronic unit.

In at least one example embodiment, the cover is configured to cover the air vent and the at least one spacer is configured to contact at least a portion of a top surface of the air vent.

In at least one example embodiment, the top wall of the cover defines at least one hole. The at least one hole is configured to receive at least one attachment device for securing the cover to the base.

In at least one example embodiment, the at least one attachment device includes one or more screws.

In at least one example embodiment, the first sidewall and the second sidewall are perpendicular to the support wall.

In at least one example embodiment, a length of the first sidewall is greater than a length of the second sidewall.

At least one example embodiment relates to a filtering system for an electronic unit. The filtering system includes a base, an air vent, and a cover. The base includes a bottom wall defining an opening, a first sidewall extending from a perimeter of the bottom wall, a support wall, and a second sidewall. The first sidewall and the second sidewall extend from respective ends of the support wall such that a groove is defined between the first sidewall, the support wall, and the second sidewall. The air vent includes a first portion configured to extend through the opening in the bottom wall of the base and a second portion at an end of the first portion. The first portion defines a channel, and the second portion is in fluid communication with the channel. The cover is configured to be coupled to the base and cover the air vent. The cover includes a top wall including a first side and a second side, a third sidewall extending from a perimeter of the second side of the top wall, and at least one spacer extending from the second side of the top wall and configured to define a cavity between the base and the second side of the cover.

In at least one example embodiment, the at least one spacer includes a protrusion extending from a center of the second side of the top wall and configured to contact a top surface of the air vent and a plurality of ribs extending from the second side of the top wall between the protrusion and the third sidewall. The plurality of ribs are configured to contact at least a top surface of the support wall of the base.

In at least one example embodiment, the second portion of the air vent includes a top part and a bottom part. The bottom part is at the end of the first portion of the air vent and the top part is separated from the bottom part by a plurality of supports extending between the top part and the bottom part.

In at least one example embodiment, a space defined between the top part and the bottom part is in fluid communication with the channel.

In at least one example embodiment, an interior surface of the third sidewall of the cover, the second side of the top wall of the cover, an exterior surface of the second sidewall, and a top surface of the support wall define a first fluid pathway. An interior surface of the third sidewall of the cover, the second side of the top wall of the cover, an exterior surface of the second sidewall, a top surface of the support wall, an interior surface of the first sidewall, the second portion of the air vent, and the channel of the first portion of the air vent define a second fluid pathway.

In at least one example embodiment, the first fluid pathway is a liquid pathway configured to direct liquid away from the electronic unit and the second fluid pathway is an air pathway in fluid communication with the electronic unit.

In at least one example embodiment, the filtering system includes a gasket surrounding at least a portion of the first portion of the air vent. An exterior surface of the first portion of the air vent includes a plurality of threads.

In at least one example embodiment, the air vent is configured to prevent passage of liquid and solid particles into the electronic unit.

In at least one example embodiment, the top wall of the cover defines at least one hole. The at least one hole is configured to receive at least one attachment device for securing the cover to the base.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION OF EXAMPLE EMBODIMENTS

Figure 1A:
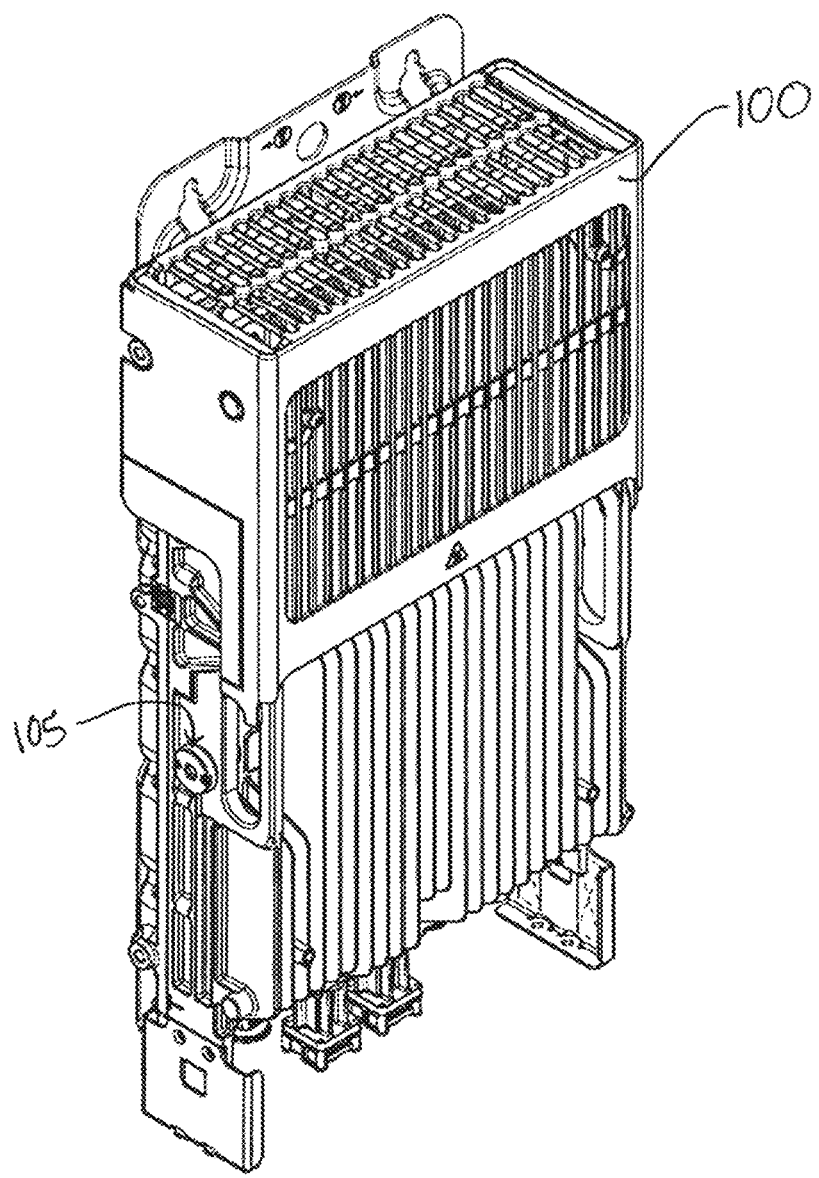
FIG. 1A is a perspective view of an electronic unit according to at least one example embodiment.

Some detailed example embodiments are disclosed herein. However, specific structural and functional details disclosed herein are merely representative for purposes of describing some example embodiments. Example embodiments may, however, be embodied in many alternate forms and should not be construed as limited to only example embodiments set forth herein.

Accordingly, while example embodiments are capable of various modifications and alternative forms, example embodiments thereof are shown by way of example in the drawings and will herein be described in detail. It should be understood, however, that there is no intent to limit an example embodiment to the particular forms disclosed, but to the contrary, example embodiments are to cover all modifications, combinations, equivalents, and alternatives falling within the scope of an example embodiment. Like numbers refer to like elements throughout the description of the figures.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, regions, layers and/or sections, these elements, regions, layers, and/or sections should not be limited by these terms. These terms are only used to distinguish one element, region, layer, or section from another region, layer, or section. Thus, a first element, region, layer, or section discussed below could be termed a second element, region, layer, or section without departing from the teachings of example embodiment.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various example embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, and/or elements, but do not preclude the presence or addition of one or more other features, integers, steps, operations, elements and/or groups thereof.

Example embodiments are described herein with reference to cross-sectional illustrations that are schematic illustrations of example embodiment. As such, variations from the shapes of the illustrations are to be expected. Thus, example embodiment should not be construed as limited to the shapes of regions illustrated herein but are to include deviations and variations in shapes.

When the words "about" and "substantially" are used in this specification in connection with a numerical value, it is intended that the associated numerical value include a tolerance of ±10% around the stated numerical value, unless otherwise explicitly defined. Moreover, when the terms "generally" or "substantially" are used in connection with geometric shapes, it is intended that precision of the geometric shape is not required but that latitude for the shape is within the scope of the disclosure. Furthermore, regardless of whether numerical values or shapes are modified as "about," "generally," or "substantially," it will be understood that these values and shapes should be construed as including a manufacturing or operational tolerance (e.g., ±10%) around the stated numerical values or shapes.

Unless otherwise defined, all terms (including technical and scientific terms) used herein have the same meaning as commonly understood by one of ordinary skill in the art to which example embodiment belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1B:
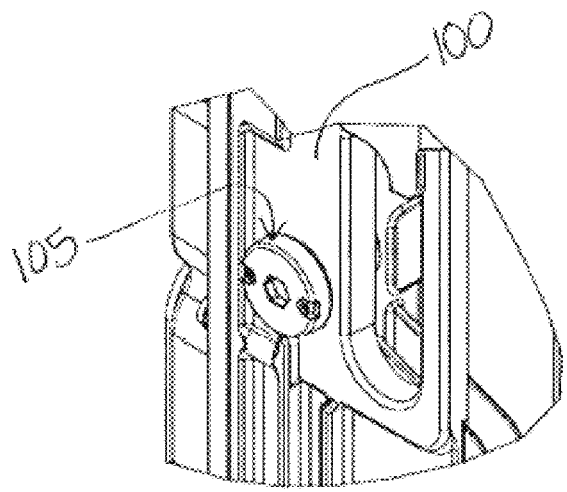
FIG. 1B is a detailed, perspective view of a filtering system of the electronic unit of FIG. 1A according to at least one example embodiment.

FIG. 1A is a perspective view of an electronic unit according to at least one example embodiment. FIG. 1B is a detailed, perspective view of a filtering system of the electronic unit of FIG. 1A according to at least one example embodiment.

Referring to FIGS. 1A and 1B, in at least one example embodiment, an electrical unit, such as an electronic unit 100, includes a filtering system 105. For example, the electronic unit 100 may include a radio frequency device, such as a remote radio head or remote radio unit. The filtering system 105 may be configured to be removably coupled or attached to the electronic unit 100. For example, at least one side of the electronic unit 100 may include at least one opening configured to receive the filtering system 105, as will be discussed in more detail below with respect to FIGS. 8A-8B. Thus, according to at least one example embodiment, the filtering system 105 may be positioned on at least one side or side surface of the electronic unit 100. In one example, the electronic unit 100 may be a remote radio head (RRH) or other radio access network (RAN) apparatus or device. Example embodiments should not, however, be limited to this example.

In at least one example embodiment, the filtering system 105 is configured to prevent and/or at least partially or substantially prevent liquid and/or solid particles from entering the electronic unit 100 while allowing air to enter and exit the electronic unit 100.

Figure 2:
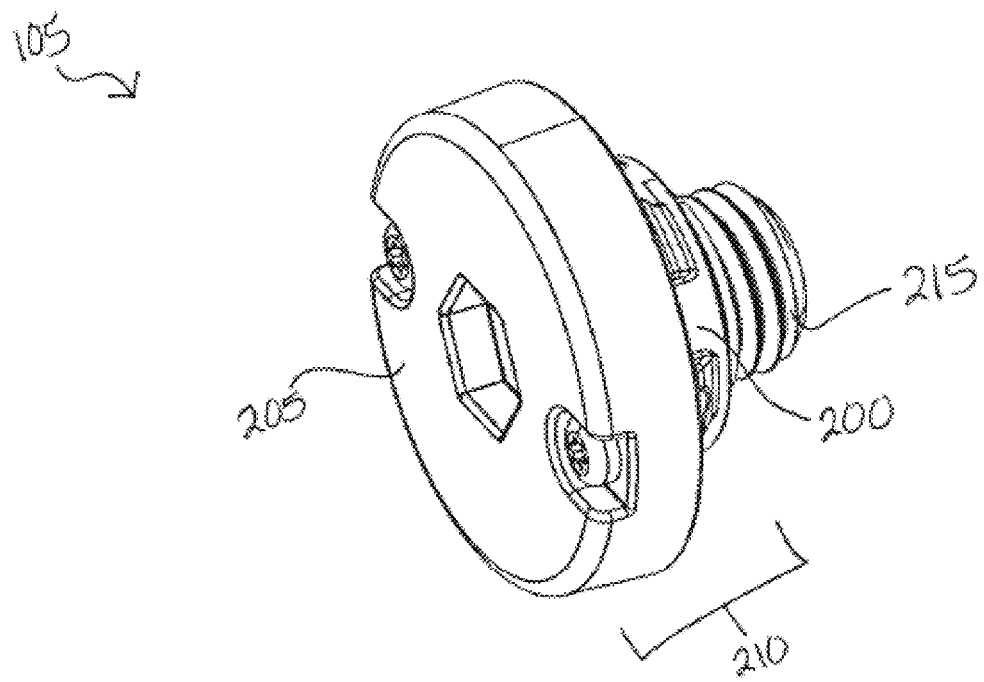
FIG. 2 is a perspective view of the filtering system of FIG. 1B according to at least one example embodiment.

FIG. 2 is a perspective view of the filtering system of FIG. 1B according to at least one example embodiment.

Referring to FIG. 2, in at least one example embodiment, the filtering system 105 includes a base 200 and a cover 205. The cover 205 is configured to be coupled to the base 200. The base 200 and the cover 205 may be referred to as a filtering apparatus 210. The filtering system 105 may also include an air vent 215. For example, the filtering apparatus 210 is configured to receive at least a portion of the air vent 215.

Figure 3:
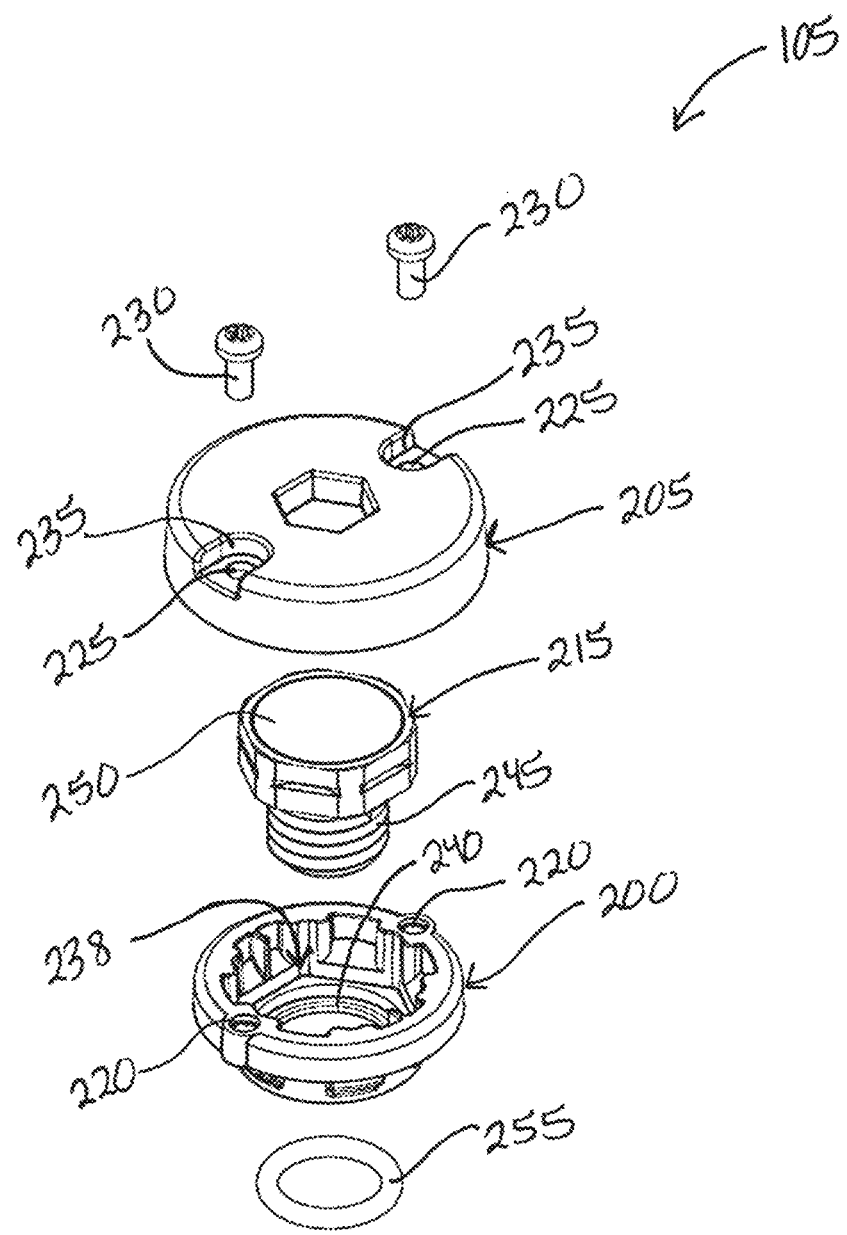
FIG. 3 is an exploded view of the filtering system of FIG. 2 according to at least one example embodiment.

FIG. 3 is an exploded view of the filtering system of FIG. 2 according to at least one example embodiment.

Referring to FIG. 3, in at least one example embodiment, the base 200 may define one or more first holes 220 and the cover 205 may define one or more second holes 225. The one or more first holes 220 may be positioned adjacent a periphery of the base 200. The one or more second holes 225 may be positioned adjacent a periphery of the cover 205. The one or more first holes 220 may be configured to align with the one or more second holes 225. In at least one example embodiment, one or more attachment devices 230 may be configured to be inserted through the one or more first holes 220 and the one or more second holes 225 to secure the cover 205 to the base 200. For example, the one or more attachment devices 230 may include one or more screws, bolts, pins, other attachment or fixing means, or the like.

In at least one example embodiment, the cover 205 includes one or more recesses 235 corresponding with the one or more second holes 225. The one or more recesses 235 allow a top surface of each of the one or more attachment devices 230 to be flush with a top of the cover 205 when inserted through the one or more second holes 225 and the one or more first holes 220.

In at least one example embodiment, the base 200 defines a cavity 238 and an opening 240. The cavity 238 and the opening 240 of the base 200 may be configured to receive at least a portion of the air vent 215. For example, the air vent 215 may include a first portion 245 and a second portion 250 at an end of the first portion 245. In at least one example embodiment, the first portion 245 of the air vent 215 may be configured to extend through the opening 240 of the base 200 and the cavity 238 of the base 200 may be configured to receive the second portion 250 of the air vent 215, as will be discussed in greater detail with respect to FIG. 7B.

Figure 7B:
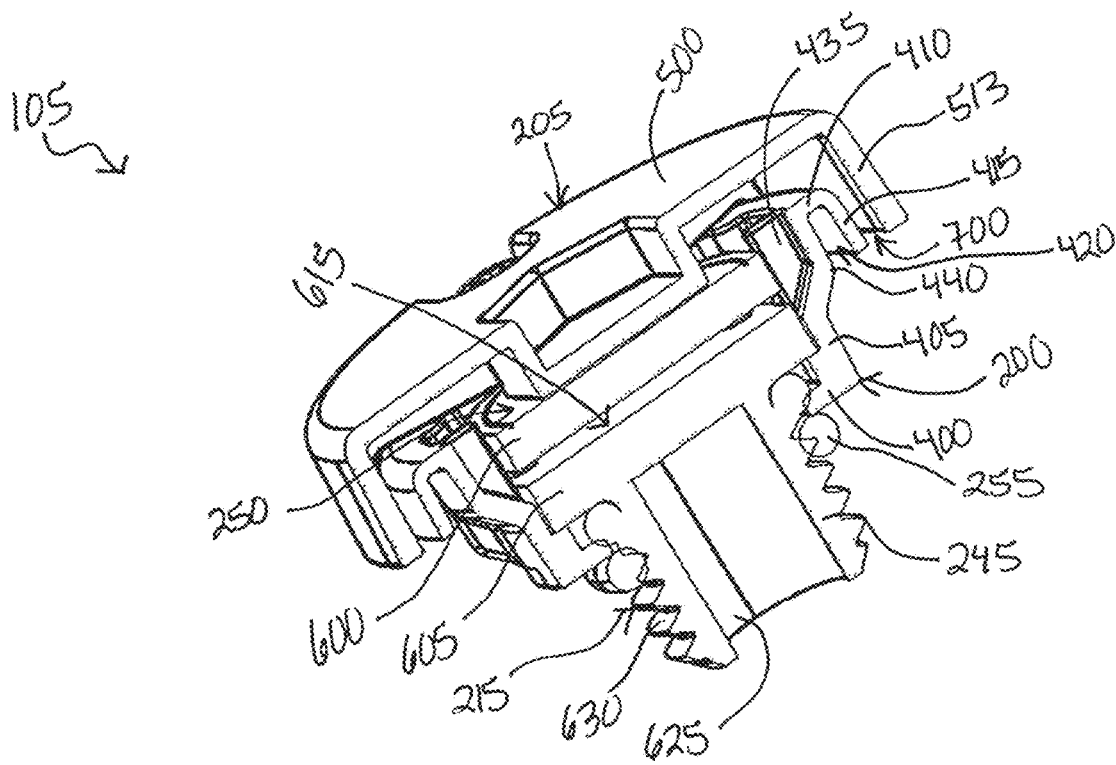
FIG. 7B is a side, cross-section view of the filtering system of FIG. 2 according to at least one example embodiment.
Figure 8A:
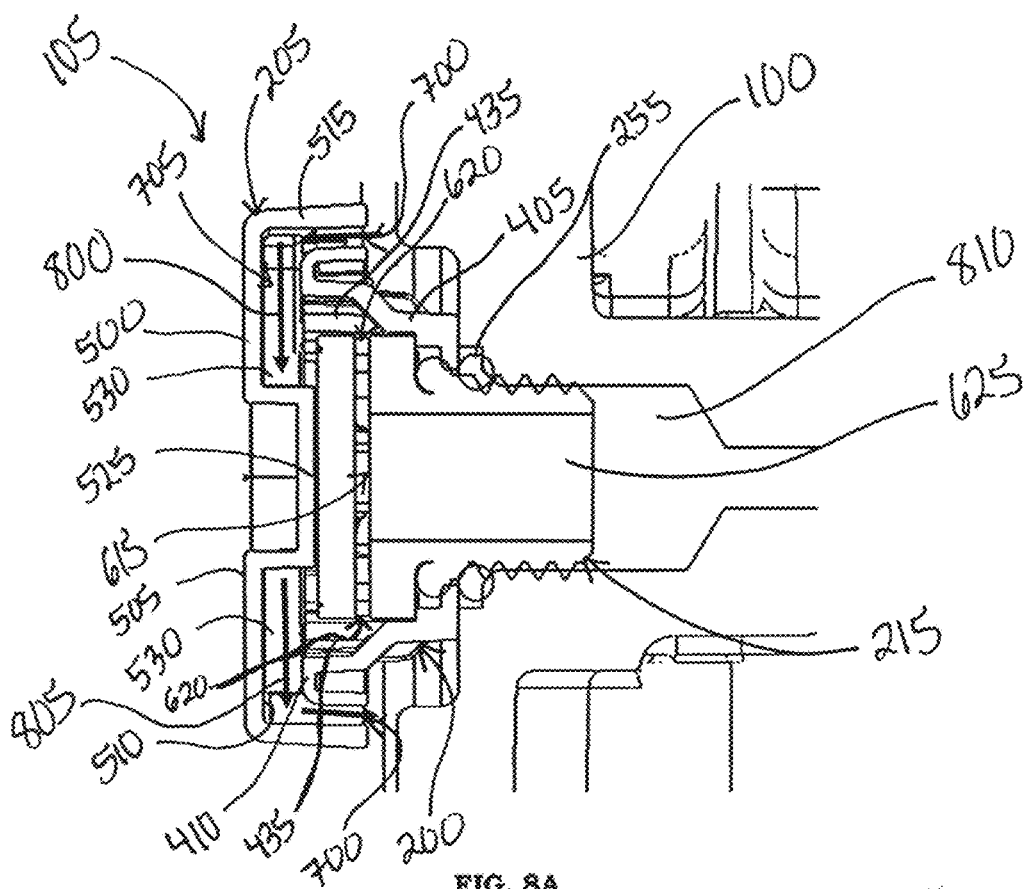
FIG. 8A is a detailed, cross-section view of the filtering system and the electronic unit of FIGS. 1A-1B showing a first fluid pathway according to at least one example embodiment.
Figure 8B:
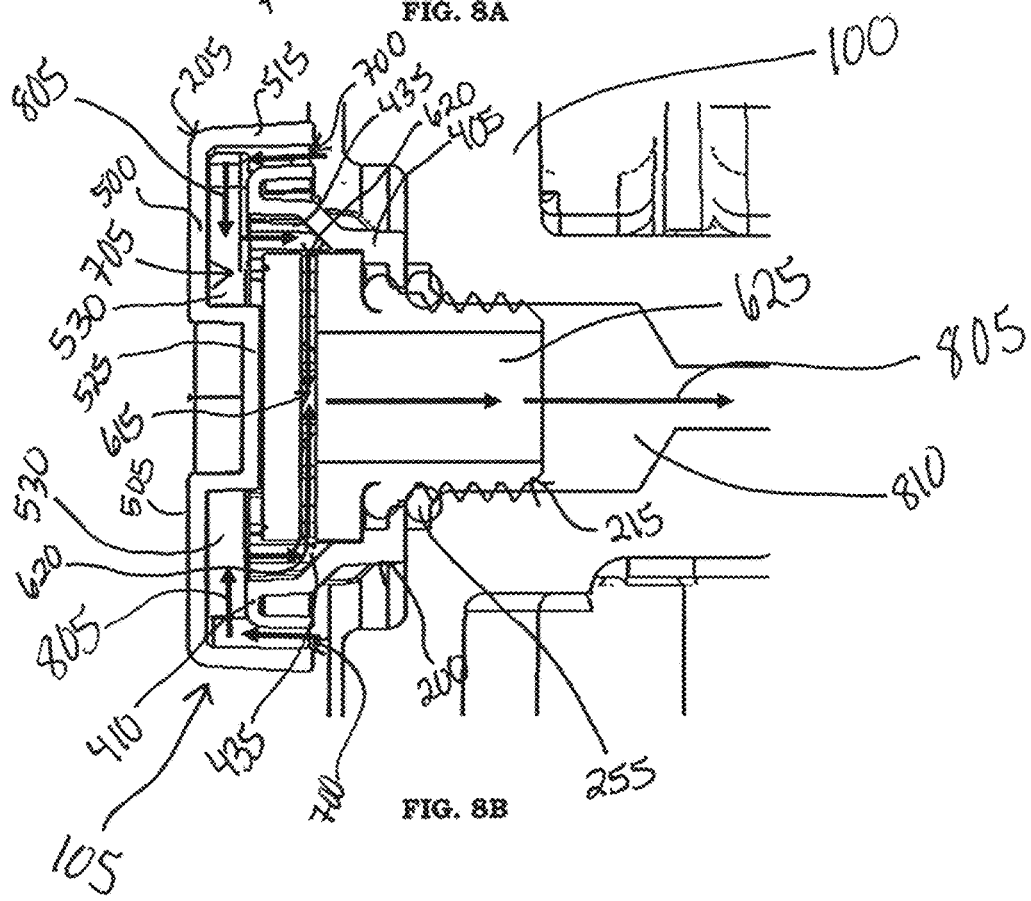
FIG. 8B is a detailed, cross-section view of the filtering system and the electronic unit of FIGS. 1A-1B showing a second fluid pathway according to at least one example embodiment.

In at least one example embodiment, the filtering system 105 includes a gasket 255. The gasket 255 may be positioned around the first portion 245 of the air vent 215 adjacent the opening 240 of the base 200, as shown in FIGS. 7B and 8A-8B. For example, the gasket 255 may be configured to be positioned between the base 200 and the electronic unit 100 when the filtering system 105 is inserted into or attached to the electronic unit 100. In at least one example embodiment, the gasket 255 is configured to create a fluid seal between the filtering apparatus 210 and the electronic unit 100.

Figure 4A:
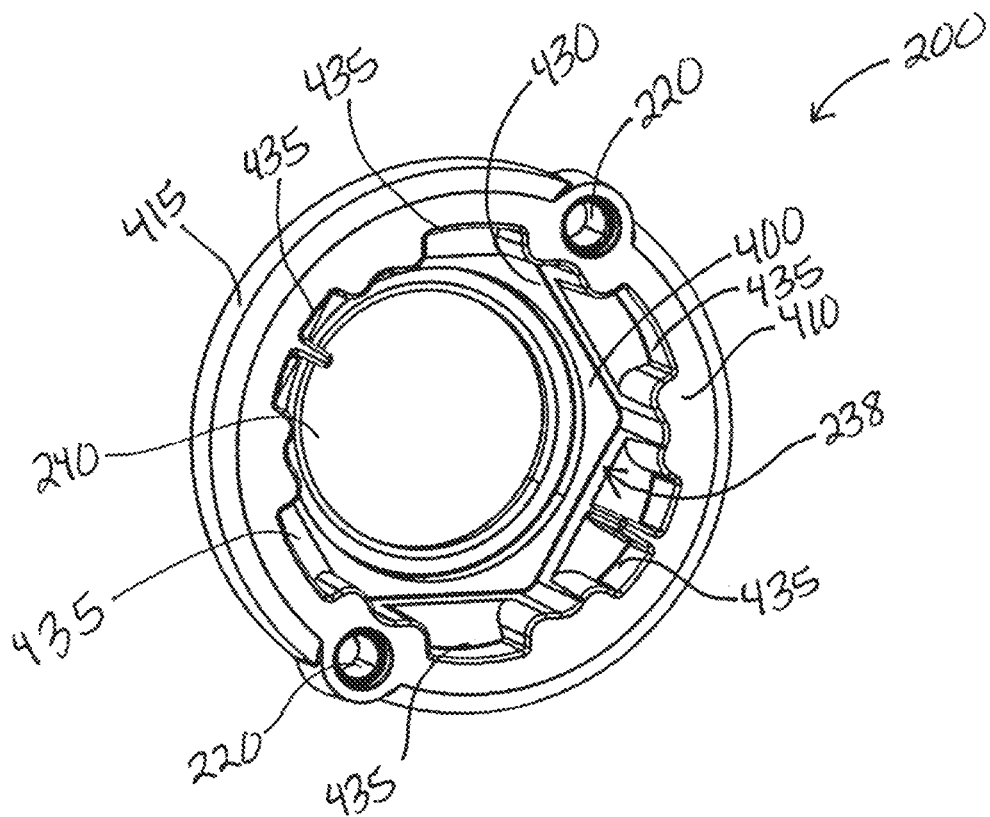
FIG. 4A is a top, perspective view of a base of the filtering system of FIGS. 2-3 according to at least one example embodiment.
Figure 4B:
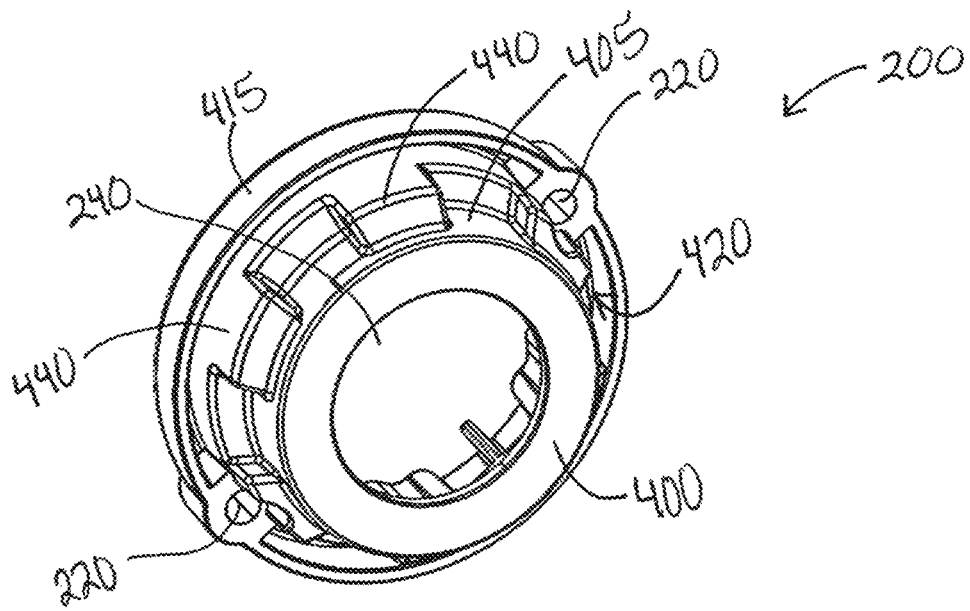
FIG. 4B is a bottom, perspective of the base of FIG. 4A according to at least one example embodiment.
Figure 4C:
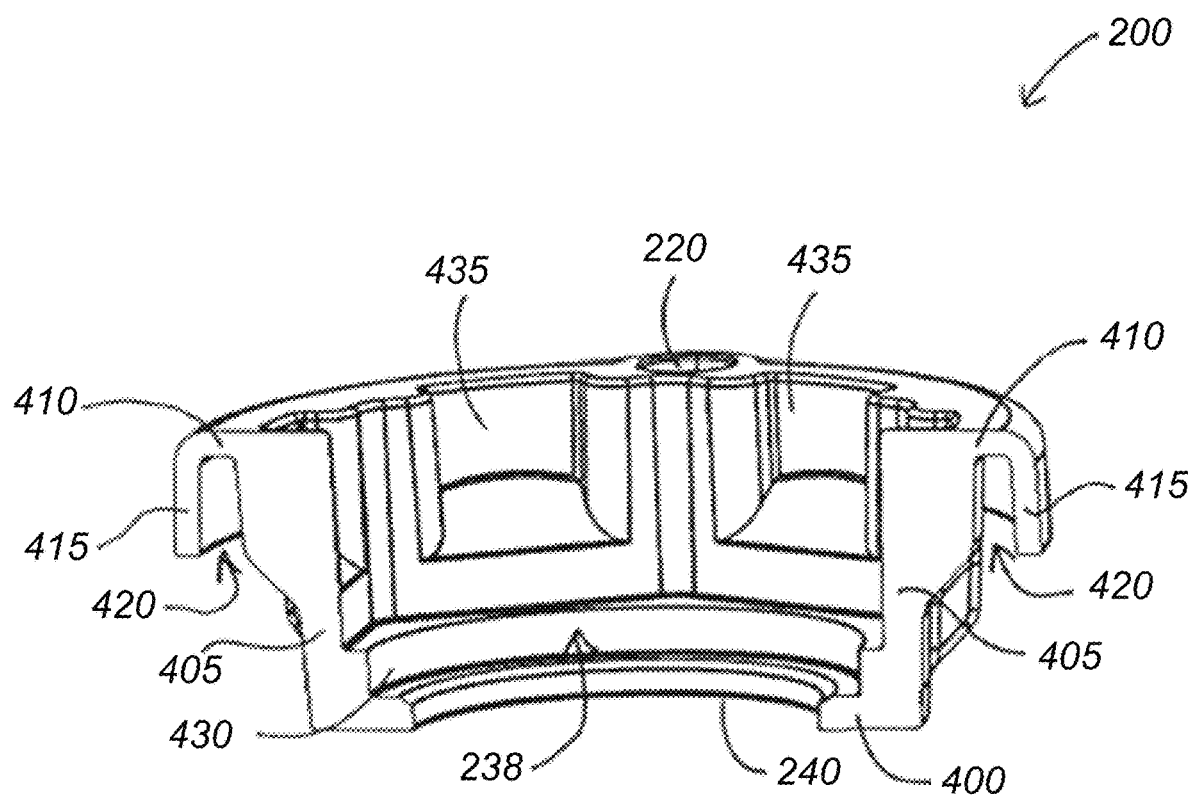
FIG. 4C is a side, cross-section view of the base of FIG. 4A according to at least one example embodiment.

FIG. 4A is a top, perspective view of the base of the filtering system of FIGS. 2-3 according to at least one example embodiment. FIG. 4B is a bottom, perspective of the base of FIG. 4A according to at least one example embodiment. FIG. 4C is a side, cross-section view of the base of FIG. 4A according to at least one example embodiment.

Referring to FIGS. 4A-4C, in at least one example embodiment, the base 200 includes a bottom wall 400, a first sidewall 405 extending from a perimeter of the bottom wall 400, a support wall 410, and a second sidewall 415. The first sidewall 405 and the second sidewall 415 extend from respective ends of the support wall 410. For example, the first sidewall 405 and the second sidewall 415 may be perpendicular or substantially perpendicular to the support wall 410. A length of the first sidewall 405 may be greater than a length of the second sidewall 415. In other example embodiments, the length of the second sidewall 415 may be equal to or greater than the length of the first sidewall 405.

In at least one example embodiment, the first sidewall 405, the support wall 410, and the second sidewall 415 define a groove 420. The groove 420 may extend at least partially about a perimeter of the first sidewall 405. For example, the first holes 220 of the base 200 may extend through the support wall 410 and the groove 420 may extend between each of the first holes 220.

In at least one example embodiment, the bottom wall 400 of the base 200 defines the opening 240 and the bottom wall 400 and the first sidewall 405 of the base 200 define the cavity 238. The opening 240 is in fluid communication with the cavity 238. The base 200 is configured to receive the air vent 215 such that the first portion 245 extends through the opening 240 and the second portion 250 is within the cavity 238. In at least one example embodiment, the bottom wall 400 of the base 200 defines a bottom recess 430. The bottom recess 430 may surround the opening 240 and have a shape corresponding to a shape of the second portion 250 of the air vent 215. For example, the second portion 250 of the air vent 215 may comprise a polygonal shape having at least three sides. In one example, the second portion 250 may have six sides as shown in FIG. 3. The bottom recess 430 of the base 200 may include the same number of sides as the second portion 250 such that at least a portion of the second portion 250 is configured to be seated within the bottom recess 430. In other example embodiments, the second portion 250 of the air vent 215 and the bottom recess 430 may have a circular shape.

In at least one example embodiment, the first sidewall 405 may define a plurality of side recesses 435. The plurality of side recesses 435 may be positioned about the interior surface of the first sidewall 405 within the cavity 238. The plurality of side recesses 435 may create a plurality of corresponding extensions, such as side extensions 440, extending from an exterior surface of the first sidewall 405, as shown in at least FIG. 4B. The plurality of side recesses 435 may comprise one or more different sizes, widths, and/or shapes. In other example embodiments, each of the plurality of side recesses 435 may be the same size and shape. Each of the plurality of side recesses 435 may create a gap between the second portion 250 of the air vent 215 and the interior surface of the first sidewall 405 when the air vent 215 is positioned within the base 200 such that fluid (e.g., air) may flow between the first sidewall 405 and the second portion 250, as will be discussed in greater detail with respect to FIGS. 8A-8B. As shown in FIG. 4A, for example, the plurality of side recesses 435 may be spaced apart evenly from one another about the perimeter of the interior surface of the first sidewall 405 within the cavity 238. However, example embodiments should not be limited to this example. Rather, the plurality of side recesses may be spaced apart unevenly in other embodiments. Similarly, the side extensions 440, extending from an exterior surface of the first sidewall 405, may be spaced apart evenly or unevenly from one another.

Figure 5A:
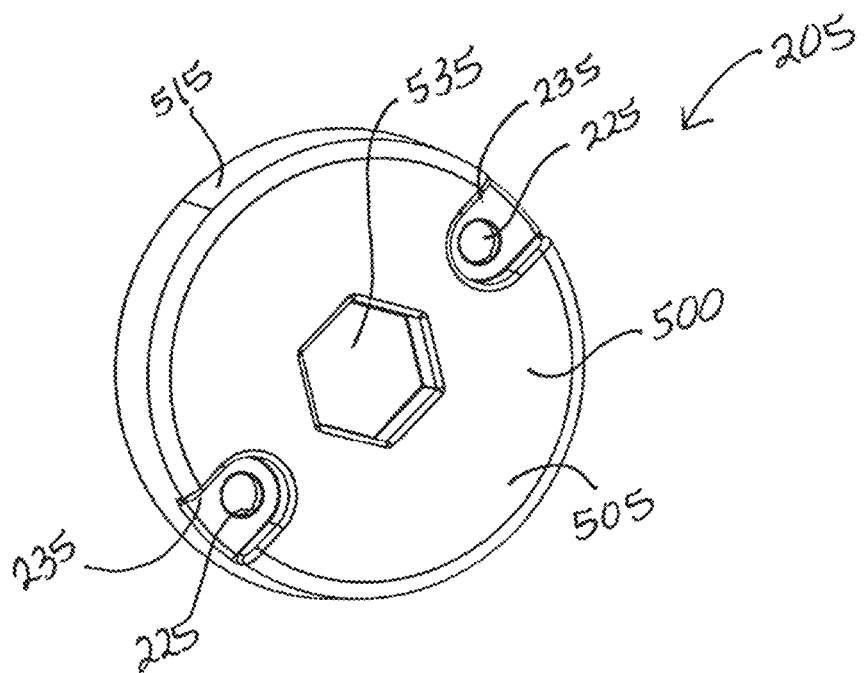
FIG. 5A is a top, perspective view of a cover of the filtering system of FIGS. 2-3 according to at least one example embodiment.
Figure 5B:
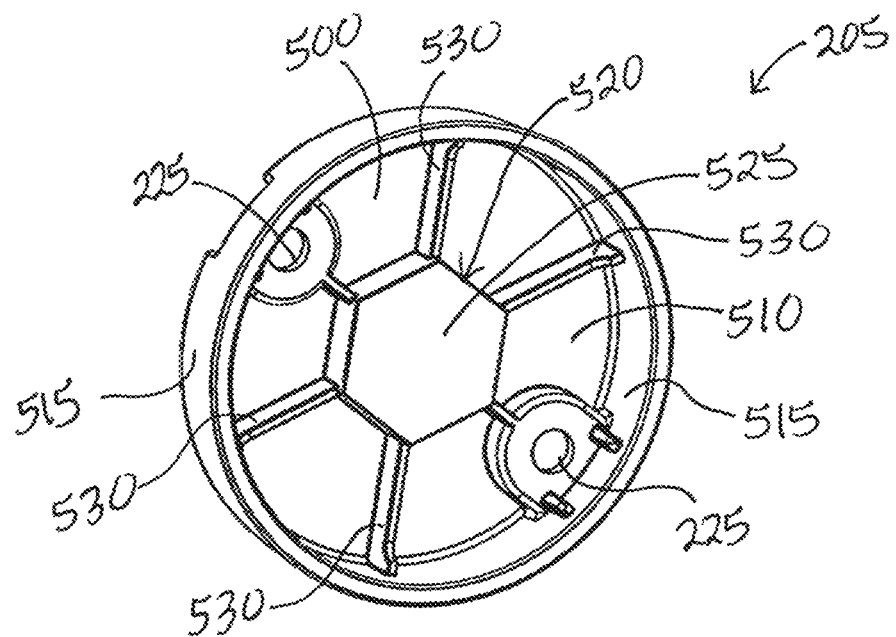
FIG. 5B is a bottom, perspective view of the cover of FIG. 5A according to at least one example embodiment.

FIG. 5A is a top, perspective view of the cover of the filtering system of FIGS. 2-3 according to at least one example embodiment. FIG. 5B is a bottom, perspective view of the cover of FIG. 5A according to at least one example embodiment.

Referring to FIGS. 5A and 5B, in at least one example embodiment, the cover 205 includes a top wall 500 having a first side 505 and a second side 510. The cover 205 also includes a third sidewall 515 extending from a perimeter of the second side 510 of the top wall 500. The third sidewall 515 may be perpendicular or substantially perpendicular to the top wall 500. As mentioned above with respect to FIG. 3, the top wall 500 may define one or more second holes 225 configured to receive the one or more attachment devices 230 and may define one or more recesses 235 surrounding or partially surrounding the one or more second holes 225.

In at least one example embodiment, the cover 205 includes at least one spacer 520 extending from the second side 510 of the top wall 500. The at least one spacer 520 may be configured to define one or more cavities or compartments between the base 200 and the cover 205 when the cover 205 is coupled to the base 200, as will be discussed with respect to at least FIG. 7A. The at least one spacer 520 may include a protrusion 525 and/or a plurality of ribs 530 extending from the second side 510 of the top wall 500. For example, the protrusion 525 may extend from a center or central portion of the second side 510 of the top wall 500. In at least one example embodiment, the first side 505 of the top wall 500 defines a recess corresponding to the protrusion 525, such as a top recess 535. The plurality of ribs 530 may extend from the second side 510 of the top wall 500 between the protrusion 525 and the third sidewall 515. As shown in the example illustrated in FIGS. 5A and 5B, the protrusion 525 and the top recess 535 may have a hexagonal shape, and each of six ribs 530 may extend from a vertex of the hexagonal shape towards the third sidewall 515. Example embodiments should not, however, be limited to this example.

Figure 6A:
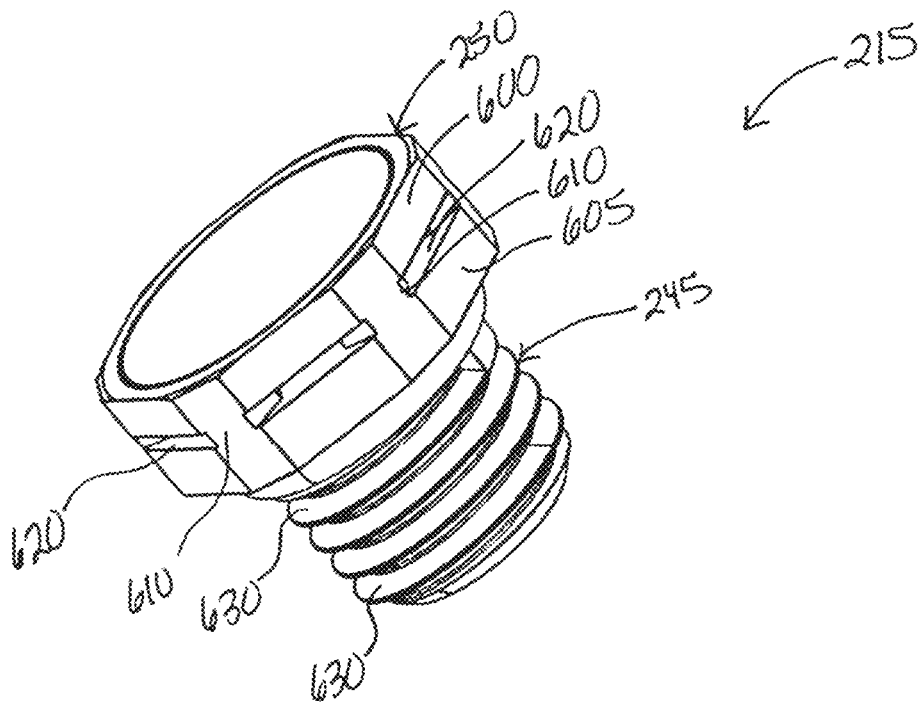
FIG. 6A is a side, perspective view of an air vent of the filtering system of FIGS. 2-3 according to at least one example embodiment.
Figure 6B:
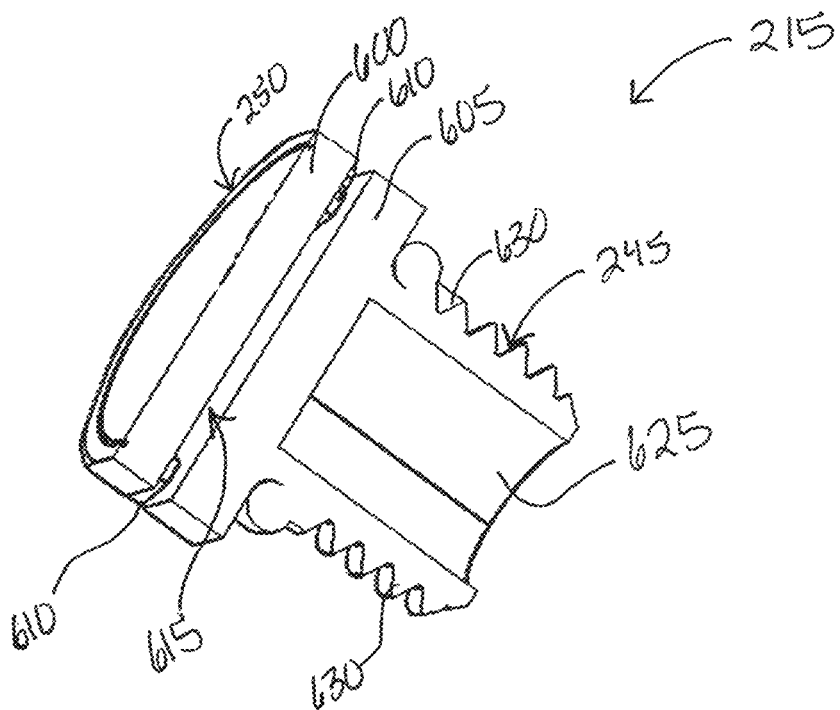
FIG. 6B is a side, cross-section view of the air vent of FIG. 6A according to at least one example embodiment.

FIG. 6A is a side, perspective view of the air vent of the filtering system of FIGS. 2-3 according to at least one example embodiment. FIG. 6B is a side, cross-section view of the air vent of FIG. 6A according to at least one example embodiment.

Referring to FIGS. 6A and 6B, in at least one example embodiment, the first portion 245 of the air vent 215 may have a cylindrical or substantially cylindrical shape. The second portion 250 of the air vent 215 may have a polygonal shape. In one example, the second portion 250 may have a polygonal shape with a plurality of sides of differing lengths. In another example, the second portion may have a cylindrical or substantially cylindrical shape. A circumference or diameter of the second portion 250 may be greater than a circumference or diameter of the first portion 245. In other example embodiments, the circumference or diameter of the first portion 245 may be the same or substantially the same as the circumference or diameter of the second portion 250.

In at least one example embodiment, the second portion 250 of the air vent 215 includes a top part 600 and a bottom part 605. The bottom part 605 is at an end of the first portion 245 of the air vent 215. The top part 600 may be separated from the bottom part 605 by a plurality of supports 610 to define a space 615 between the top part 600 and the bottom part 605. For example, the plurality of supports 610 may be spaced about an outer perimeter of the second portion 250 between the top part 600 and the bottom part 605. The second portion 250 may also define a plurality of side openings 620 between each of the plurality of supports 610 in fluid communication with the space 615.

In at least one example embodiment, the first portion 245 of the air vent 215 defines a channel 625. The channel 625 may comprise a cylindrical or substantially cylindrical shape and extend along a length of the first portion 245. The channel 625 is in fluid communication with the space 615 between the top part 600 and the bottom part 605. The channel is also configured to be in fluid communication with the electronic unit 100. In at least one example embodiment, the air vent 215 includes a membrane filter configured to prevent or substantially prevent the passage of liquid and/or solid particles into the electronic unit 100. For example, the membrane filter is configured to prevent or substantially prevent the passage of liquid and/or solid particles into the channel 625 and the electronic unit 100 from the space 615 while allowing air to flow between the space 615 and the channel 625. In at least one example embodiment, at least a portion of the bottom part 605 of the air vent includes the membrane filter. In other example embodiments, the membrane filter is fluidly coupled to or within the channel 625.

In at least one example embodiment, an exterior surface of the first portion 245 of the air vent 215 comprises a plurality of threads 630. The plurality of threads 630 may be configured to secure the air vent 215, and thereby the filtering system 105 including the base 200 and the cover 205, to the electronic unit 100, as will be described with respect to FIGS. 8A-8B.

Figure 7A:
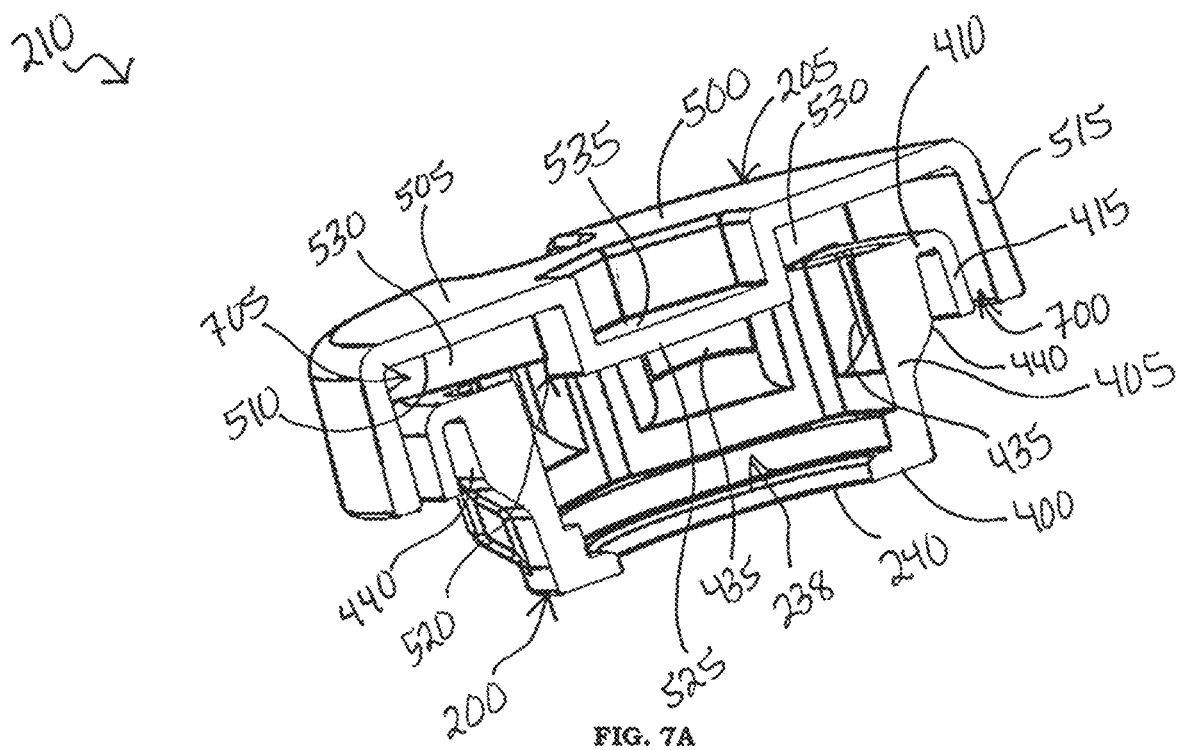
FIG. 7A is a side, cross-section view of a base and a cover of FIG. 2 according to at least one example embodiment.

FIG. 7A is a side, cross-section view of the base and the cover of FIG. 2 according to at least one example embodiment. FIG. 7B is a side, cross-section view of the filtering system of FIG. 2 according to at least one example embodiment.

Referring to FIGS. 7A and 7B, the base 200 and the cover 205 form the filtering apparatus 210 of the filtering system 105. The cover 205 is configured to be coupled to the base 200. For example, the cover 205 defines a portion of the cavity 238 when coupled to the base 200. The cover 205 is also configured to cover the air vent 215, as shown in FIG. 7B. For example, the air vent 215 may be inserted into the opening 240 and seated within the cavity 238 of the base 200 prior to attaching the cover 205. The cover 205 may then be coupled to the base 200. The cover 205 may be secured to the base 200 by the one or more attachment devices 230 such that the base 200, the cover 205, and the air vent 215 are secured (e.g., removably secured) together, as shown in FIG. 7B.

With reference to FIG. 7A, the third sidewall 515 of the cover 205 is configured to be parallel or substantially parallel with the second sidewall 415 of the base 200 when the cover 205 is coupled to the base 200. A circumference or diameter of the cover 205 is greater than a circumference or diameter of the base 200 such that a gap 700 is defined between the second sidewall 415 of the base 200 and the third sidewall 515 of the cover 205. The gap 700 is configured to be in fluid communication with the cavity 238. In at least one example embodiment, the gap 700, the second sidewall 415, and the third sidewall 515 are cylindrical or substantially cylindrical. However, example embodiments should not be limited to this example.

In at least one example embodiment, at least a portion of the at least one spacer 520 is configured to contact a top surface of the support wall 410 of the base 200. For example, at least a portion of each of the ribs 530 are configured to contact a top surface of the support wall 410 of the base 200. The protrusion 525 may be configured to contact a top surface of the air vent 215, such as a top surface of the top part 600, as shown in FIG. 7B. In at least one example embodiment, the second side 510 of the top wall 500 of the cover 205, each of the plurality of ribs 530, the protrusion 525, and the support wall 410 of the base 200 define a plurality of compartments 705. Each of the plurality of compartment 705 are fluidly coupled between the gap 700 and the cavity 238 of the base 200. For example, each of the plurality of compartments 705 may be fluidly coupled to the cavity 238 via the plurality of side recesses 435.

Still referring to FIG. 7A, the ambient environment may be in fluid communication with the interior of the filtering apparatus 210 through the gap 700, the one or more compartments 705, and the cavity 238.

Referring to FIG. 7B, when the air vent 215 is within the filtering apparatus 210, the ambient environment may be in fluid communication with the air vent 215 via the gap 700, the one or more compartments 705, the plurality of side recesses 435, the side openings 620 and the space 615 of the second portion 250, and the channel 625.

FIG. 8A is a detailed, cross-section view of the filtering system and the electronic unit of FIGS. 1A-1B showing a first fluid pathway according to at least one example embodiment. FIG. 8B is a detailed, cross-section view of the filtering system and the electronic unit of FIGS. 1A-1B showing a second fluid pathway according to at least one example embodiment.

Referring to FIGS. 8A and 8B, in at least one example embodiment, the filtering system 105 is configured to be removably coupled to the electronic unit 100. For example, the filtering system 105 may be coupled to the electronic unit 100 by threaded engagement using the threads 630 of the air vent 215. The threads 630 may be configured to engage an interior surface of a cavity 810 defined by the electronic unit 100. In other example embodiments, the filtering system 105 may be removably coupled to the cavity 810 of the electronic unit 100 by a friction fit, snap fit, or other engagement mechanism or means.

As mentioned above with respect to FIG. 3, the filtering system 105 may include a gasket 255. In at least one example embodiment, the gasket 255 surrounds the first portion 245 of the air vent 215 adjacent the second portion 250. For example, the gasket 255 contacts at least a portion of a lower surface of the bottom part 605 of the second portion 250 of the air vent 215. As shown in FIGS. 8A-8B, the gasket 255 is between the filtering system 105 and the electronic unit 100 and configured to create a fluid seal.

In at least one example embodiment, the filtering system 105 is configured to create at least two fluid pathways. With reference to FIG. 8A, an interior surface of the third sidewall 515 of the cover 205, the second side 510 of the top wall 500 of the cover 205, an exterior surface of the second sidewall 415 of the base 200, and a top surface of the support wall 410 define a first fluid pathway 800.

In at least one example embodiment, the first fluid pathway 800 is configured to direct liquid and/or solid particles that enter the filtering system 105 from the ambient environment away from the electronic unit 100. For example, liquid and/or solid particles may enter the filtering system 105 through the gap 700. The first fluid pathway 800 directs the liquid and/or solid particles from the gap 700 into the compartment 705 and then towards the opposite end or bottom of the filtering system 105 by gravity such that the liquid and/or solid particles exit the filtering system 105 via one of the compartments 705 and the gap 700 at the opposite end of the filtering system 105. The liquid and/or solid particles within the first fluid pathway 800 may be directed toward the bottom of the filtering system 105 through each of the compartments 705 defined by the plurality of ribs 530 and the protrusion 525.

In at least one example embodiment, the first fluid pathway 800 prevents or substantially prevents liquid and/or solid particles, such as dust, from entering the air vent 215 so the air vent does not get blocked. For example, if liquid and/or solid particles accumulate at or within the air vent 215, the air vent 215 may become blocked and air flow in and out of the electronic unit 100 may be inhibited. Such blockage may create pressure in the electronic unit 100, such as a vacuum, which can cause the electronic unit 100 to malfunction.

With reference to FIG. 8B, an interior surface of the third sidewall 515 of the cover 205, the second side 510 of the top wall 500 of the cover 205, an exterior surface of the second sidewall 415, a top surface of the support wall 410, and an interior surface of the first sidewall 405 define at least a portion of a second fluid pathway 805. The second fluid pathway 805 may be an air pathway in fluid communication with the electronic unit 100. For example, the second fluid pathway 805 may be configured to direct air from the ambient environment through the air vent 215 and into the electronic unit 100. The second fluid pathway 805 defines a labyrinth that air can enter and traverse, but liquid and/or solid particles cannot. For example liquid and/or solid particles may drop within the filtering system 105, such as through the first fluid pathway 800, before reaching the air vent 215.

In at least one example embodiment, the second fluid pathway 805 directs air through the gap 700, the compartment 705, and the side recesses 435 towards the air vent 215. The air may enter the air vent 215 through the side openings 620, travel through the space 615 and the channel 625, and enter the electronic unit 100 through the cavity 810. As discussed above, the air vent 215 may include a membrane filter configured to prevent liquid and/or solid particles from entering the channel 625 and/or the electronic unit 100. For example, at least a portion of the bottom part 605 of the air vent 215 may comprise the membrane filter. In other example embodiments, the membrane filter may be within the channel 625 and/or the cavity 810. In still other example embodiments, the membrane filter may be within the filtering apparatus 210, such as within the filtering apparatus 210 shown in FIG. 7B. For example, the membrane filter may be positioned within the cavity 238 and/or coupled to an interior surface of the base 200 or the cover 205. In such example embodiments, the membrane filter may take the place of the air vent 215.

In at least one example embodiment, the second fluid pathway 805 may also flow in a reverse direction. For example, air may exit the electronic unit 100 through the air vent 215 and the filtering apparatus 210 of the filtering system 105. This allows the electronic unit 100 to breathe such that air may enter and exit the electronic unit 100.

Figure 9:
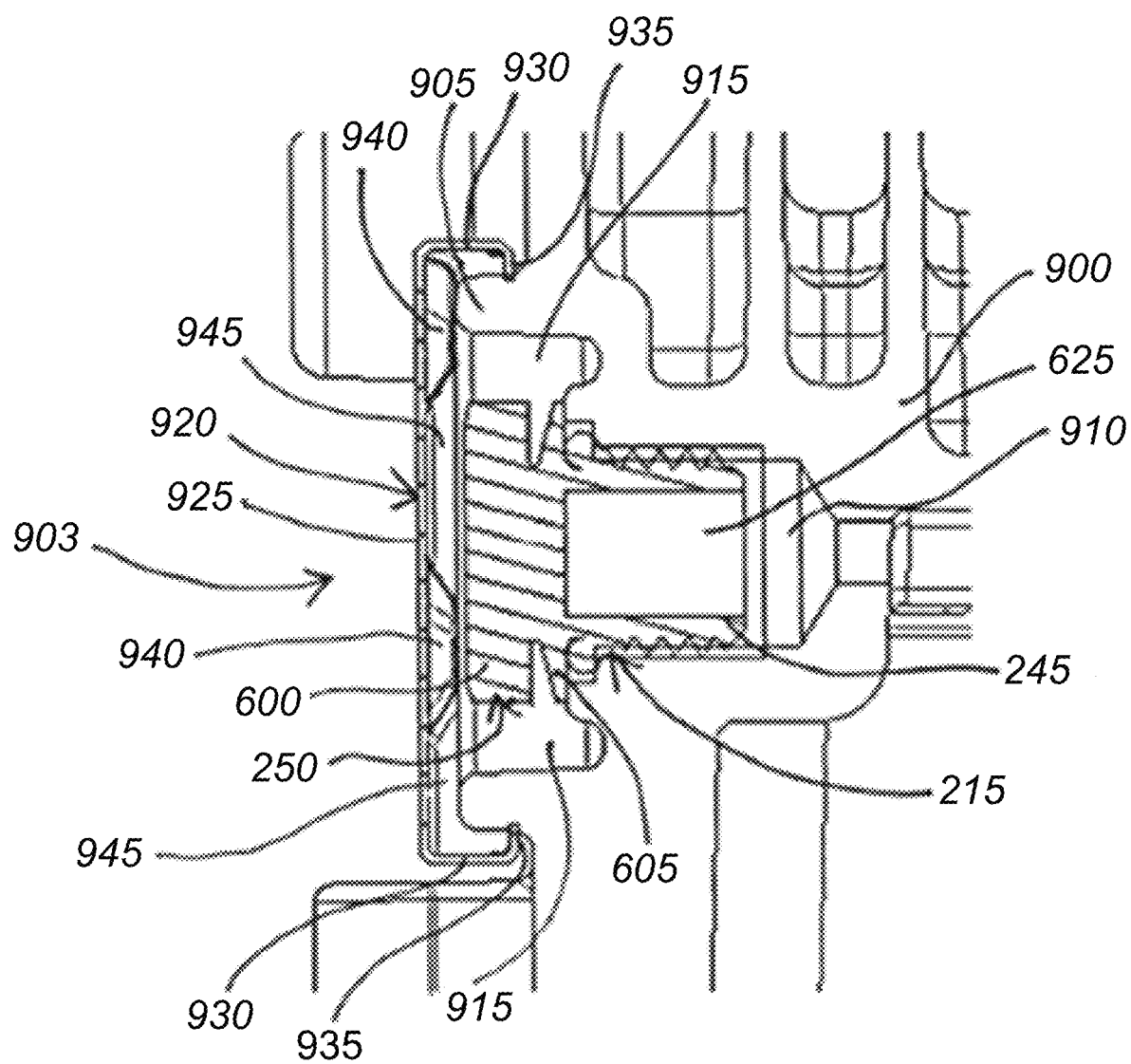
FIG. 9 is a detailed, cross-section view of another filtering system and electronic unit according to at least one example embodiment.

FIG. 9 is a detailed, cross-section view of another filtering system and electronic unit according to at least one example embodiment.

Referring to FIG. 9, in at least one example embodiment, a filtering system 903 may be integrated into an electronic unit 900. For example, the electronic unit 900 may include at least one protrusion 905 adjacent a cavity 910 defined by a side of the electronic unit 900. The cavity 910 is configured to be in fluid communication with an interior of the electronic unit 900. The at least one protrusion 905 may be a cylindrical or substantially cylindrical protrusion surrounding the cavity 910. In other example embodiments, the at least one protrusion 905 may comprise a first protrusion adjacent the cavity 910 and a second protrusion adjacent the cavity 910 opposite the first protrusion.

In at least one example embodiment, the cavity 910 is configured to receive at least a portion of a filter, such as the air vent 215 discussed above with respect to FIGS. 3 and 6A-8B. In at least one example embodiment, the at least one protrusion 905 defines a recessed space 915 adjacent the cavity 910. A circumference, width or diameter of the recessed space 915 may be greater than a circumference, width or diameter of the cavity 910. The cavity 910 may be configured to receive the first portion 245 of the air vent 215 and the recessed space 915 may be configured to receive the second portion 250 of the air vent 215. For example, the second portion 250 of the air vent 215 may be seated within the recessed space 915 such that a bottom surface of the bottom part 605 contacts a surface of the electronic unit 900 surrounding the cavity 910 and a top surface of the top part 600 of the air vent 215 is flush with an exterior surface of the at least one protrusion 905.

In at least one example embodiment, a cover 920 is coupled to the at least one protrusion 905. The cover includes a top wall 925 and a sidewall 930 extending from a perimeter of the top wall 925. The sidewall 930 may be configured to couple the cover 920 to the at least one protrusion 905. In at least one example embodiment, the cover 920 includes at least one engagement member 935 extending from an end of the sidewall 930 opposite the top wall 925. For example, the at least one engagement member 935 may extend from the end of the sidewall 930 perpendicular to the sidewall 930 and parallel to the top wall 925. The at least one engagement member 935 may be configured to engage an exterior portion of the at least one protrusion 905, such as in a snap-fit or other engagement mechanism, to secure the cover 920 to the electronic unit 900. The at least one engagement member 935 may be a single, cylindrical member extending about a perimeter of the sidewall 930. In other example embodiments, the at least one engagement member 935 may be a plurality of discrete members extending from a perimeter of the sidewall 930.

In at least one example embodiment, at least one protrusion 940 extends from an interior surface of the top wall 925 of the cover 920. The at least one protrusion 940 is configured to extend towards the air vent 215 and the electronic unit 900 when the cover 920 is coupled to the electronic unit 900. The cover also defines at least one recess 945 adjacent the at least one protrusion 940.

In at least one example embodiment, the filtering system 903 defines at least two fluid pathways. For example, the filtering system 903 defines a first fluid pathway configured to direct liquid and/or solid particles that enter the filtering system 903 away from the air vent 215 and out of the filtering system 903, such as the first fluid pathway 800 described above with respect to FIG. 8A. The first fluid pathway may be defined by an interior surface of the sidewall 930, an exterior surface of the at least one protrusion 905, and the interior surface of the top wall 925 of the cover 920. The liquid and/or solid particles may be directed downward along the interior surface of the top wall 925 by gravity, along the at least one protrusion 940, and through the at least one recess 945. Because the liquid and/or solid particles are directed along the interior surface of the cover 920, the liquid and/or solid particles may be prevented from entering the electronic unit 900 through the air vent 215. The liquid and/or solid particles may exit through a bottom portion of the cover 920.

In at least one example embodiment, the filtering system 903 defines a second fluid pathway configured to allow air to enter and exit the electronic unit 900, similar to the second fluid pathway 805 described above with respect to FIG. 8B. The second fluid pathway may be defined by an interior surface of the sidewall 930, an exterior surface of the at least one protrusion 905, at least a portion of the interior surface of the top wall 925 of the cover 920, and the recessed space 915. Air may enter and exit the air vent 215 and the electronic unit 900 via the recessed space 915 in a similar or analogous manner as described above with respect to FIG. 8B. For example, from the recessed space 915, air may enter the air vent 215 through the side openings 620 such that the air is directed through the space 615, through a membrane filter, through the channel 625, through the cavity 910, and into the electronic unit 900.

Example embodiments have been disclosed herein, however, it should be understood that other variations may be possible. Such variations are not to be regarded as a departure from the spirit and scope of the present disclosure, and all such modifications as would be obvious to one skilled in the art are intended to be included within the scope of the following claims.

We claim:

1. An apparatus for attaching to an electronic unit, comprising:
a base including,
a bottom wall defining an opening,
a first sidewall extending from a perimeter of the bottom wall,
a support wall, and
a second sidewall, the first sidewall and the second sidewall extending from respective ends of the support wall such that a groove is defined between the first sidewall, the support wall, and the second sidewall; and
a cover configured to be coupled to the base, the cover including,
a top wall including a first side and a second side,
a third sidewall extending from a perimeter of the second side of the top wall, and
at least one spacer extending from the second side of the top wall and configured to define a cavity between the base and the cover; wherein
an interior surface of the third sidewall of the cover, the second side of the top wall of the cover, an exterior surface of the second sidewall, and a top surface of the support wall define a first fluid pathway; and
an interior surface of the third sidewall of the cover, the second side of the top wall of the cover, an exterior surface of the second sidewall, a top surface of the support wall, and an interior surface of the first sidewall define a second fluid pathway, and
wherein the first fluid pathway is a liquid pathway configured to direct liquid away from the electronic unit; and
the second fluid pathway is an air pathway in fluid communication with the electronic unit.

2. The apparatus of claim 1, wherein the at least one spacer includes,
a protrusion extending from a center of the second side of the top wall; and
a plurality of ribs extending from the second side of the top wall between the protrusion and the third sidewall, the plurality of ribs configured to contact at least a top surface of the support wall of the base.

3. The apparatus of claim 1, further comprising an air vent within the opening of the bottom wall.

4. The apparatus of claim 3, wherein the air vent is configured to prevent passage of liquid and solid particles into the electronic unit.

5. The apparatus of claim 3, wherein the cover is configured to cover the air vent and the at least one spacer is configured to contact at least a portion of a top surface of the air vent.

6. The apparatus of claim 1, wherein the top wall of the cover defines at least one hole, the at least one hole configured to receive at least one attachment device for securing the cover to the base.

7. The apparatus of claim 6, wherein the at least one attachment device comprises one or more screws.

8. The apparatus of claim 1, wherein the first sidewall and the second sidewall are perpendicular to the support wall.

9. The apparatus of claim 1, wherein a length of the first sidewall is greater than a length of the second sidewall.

10. A filtering system for an electronic unit, the filtering system comprising:
a base including,
a bottom wall defining an opening,
a first sidewall extending from a perimeter of the bottom wall,
a support wall, and
a second sidewall, the first sidewall and the second sidewall extending from respective ends of the support wall such that a groove is defined between the first sidewall, the support wall, and the second sidewall;
an air vent including,
a first portion configured to extend through the opening in the bottom wall of the base, the first portion defining a channel, and
a second portion at an end of the first portion and in fluid communication with the channel; and
a cover configured to be coupled to the base and cover the air vent, the cover including,
a top wall including a first side and a second side,
a third sidewall extending from a perimeter of the second side of the top wall, and
at least one spacer extending from the second side of the top wall and configured to define a cavity between the base and the second side of the cover; wherein
an interior surface of the third sidewall of the cover, the second side of the top wall of the cover, an exterior surface of the second sidewall, and a top surface of the support wall define a first fluid pathway; and
an interior surface of the third sidewall of the cover, the second side of the top wall of the cover, an exterior surface of the second sidewall, a top surface of the support wall, an interior surface of the first sidewall, the second portion of the air vent, and the channel of the first portion of the air vent define a second fluid pathway, and
wherein the first fluid pathway is a liquid pathway configured to direct liquid away from the electronic unit; and
the second fluid pathway is an air pathway in fluid communication with the electronic unit.

11. The filtering system of claim 10, wherein the at least one spacer includes,
a protrusion extending from a center of the second side of the top wall and configured to contact a top surface of the air vent, and
a plurality of ribs extending from the second side of the top wall between the protrusion and the third sidewall, the plurality of ribs configured to contact at least a top surface of the support wall of the base.

12. The filtering system of claim 10, wherein:
the second portion of the air vent includes a top part and a bottom part;
the bottom part at the end of the first portion of the air vent; and
the top part separated from the bottom part by a plurality of supports extending between the top part and the bottom part.

13. The filtering system of claim 12, wherein a space defined between the top part and the bottom part is in fluid communication with the channel.

14. The filtering system of claim 10, further comprising:
a gasket surrounding at least a portion of the first portion of the air vent; and
wherein an exterior surface of the first portion of the air vent includes a plurality of threads.

15. The filtering system of claim 10, wherein the air vent is configured to prevent passage of liquid and solid particles into the electronic unit.

16. The filtering system of claim 10, wherein the top wall of the cover defines at least one hole, the at least one hole configured to receive at least one attachment device for securing the cover to the base.

\* \* \* \* \*